(12) United States Patent
Shimoda (10) Patent No.: US 8,040,682 B2
(45) Date of Patent: Oct. 18, 2011

(54) SEMICONDUCTOR DEVICE

(75) Inventor: Tsuneyuki Shimoda, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 888 days.

(21) Appl. No.: 11/580,247

(22) Filed: Oct. 13, 2006

(65) Prior Publication Data

US 2007/0096308 A1    May 3, 2007

(30) Foreign Application Priority Data

Oct. 14, 2005   (JP) ................................. 2005-299978

(51) Int. Cl.
*H01R 12/16*    (2006.01)

(52) U.S. Cl. ........ 361/785; 361/729; 361/760; 361/764; 361/783; 361/790; 257/678; 257/686; 257/723; 439/59; 439/60; 439/62; 439/79; 439/330

(58) Field of Classification Search ................ 361/785, 361/729, 760, 790, 764, 783; 257/723, 678, 257/686; 439/79, 330, 59–62
See application file for complete search history.

(56) References Cited

U.S. PATENT DOCUMENTS

| | | | | |
|---|---|---|---|---|
| 4,405,929 A * | 9/1983 | Sugano | ........................... | 347/180 |
| 4,616,895 A * | 10/1986 | Yoshizaki et al. | ............ | 439/330 |
| 4,864,116 A * | 9/1989 | Banjo et al. | .................... | 235/492 |
| 5,103,247 A * | 4/1992 | Sugano et al. | ................ | 361/785 |
| 5,208,729 A * | 5/1993 | Cipolla et al. | ................ | 361/690 |
| 5,227,664 A * | 7/1993 | Toshio et al. | .................. | 257/723 |
| 5,980,267 A * | 11/1999 | Ayers et al. | ...................... | 439/60 |
| 5,995,378 A * | 11/1999 | Farnworth et al. | ............ | 361/796 |
| 6,007,357 A * | 12/1999 | Perino et al. | ................... | 439/327 |
| 6,094,057 A * | 7/2000 | Hiruta et al. | ................... | 324/755 |
| 6,222,739 B1* | 4/2001 | Bhakta et al. | ................ | 361/790 |
| 6,392,897 B1* | 5/2002 | Nakase et al. | ................ | 361/785 |
| 6,472,744 B1* | 10/2002 | Sato et al. | ...................... | 257/723 |
| 6,713,854 B1* | 3/2004 | Kledzik et al. | ................ | 257/686 |
| 6,757,751 B1* | 6/2004 | Gene | ................................ | 710/36 |
| 6,882,241 B2* | 4/2005 | Abo et al. | ........................ | 333/33 |
| 6,898,085 B2* | 5/2005 | Haba et al. | ..................... | 361/760 |
| 6,954,082 B2* | 10/2005 | Grillette | ......................... | 324/765 |
| 6,976,848 B2* | 12/2005 | Choi | ................................ | 439/61 |
| 7,005,878 B2* | 2/2006 | Cobbley et al. | ................ | 324/765 |
| 7,055,757 B2* | 6/2006 | Nishizawa et al. | ........... | 235/492 |
| 7,085,872 B2* | 8/2006 | Liaw et al. | ..................... | 710/305 |
| 7,126,219 B2* | 10/2006 | Hsieh et al. | .................... | 257/723 |
| 7,132,841 B1* | 11/2006 | Bertin et al. | ................... | 324/765 |
| 7,161,820 B2* | 1/2007 | Funaba et al. | .................. | 365/52 |
| 7,170,314 B2* | 1/2007 | Haba et al. | ....................... | 326/30 |
| 7,227,759 B2* | 6/2007 | Grundy et al. | ................ | 361/785 |
| 7,414,312 B2* | 8/2008 | Nguyen et al. | ................ | 257/724 |
| 2004/0159938 A1* | 8/2004 | Hedler et al. | ................. | 257/723 |
| 2006/0049500 A1* | 3/2006 | Goodwin | ....................... | 257/686 |
| 2007/0020964 A1* | 1/2007 | Tzu | ................................. | 439/73 |

FOREIGN PATENT DOCUMENTS

JP         11-067985       3/1999

* cited by examiner

*Primary Examiner* — Xiaoliang Chen (74) *Attorney, Agent, or Firm* — Banner & Witcoff, Ltd.

(57) ABSTRACT

A semiconductor device comprises: a plurality of semiconductor chip; a socket; and a mounting board equipped with the socket. Each of the semiconductor chips has a major surface, a back surface and a plurality of connection terminals on the major surface. The socket has internal connection terminals inside and external connection terminals outside, and the internal connection terminals are in contact with the connection terminals of the semiconductor chips.

5 Claims, 7 Drawing Sheets

SEMICONDUCTOR DEVICE

CROSS-REFERENCE TO RELATED APPLICATIONS

This application is based upon and claims the benefit of priority from the prior Japanese Patent Application No. 2005-299978, filed on Oct. 14, 2005; the entire contents of which are incorporated herein by reference.

BACKGROUND OF THE INVENTION

1. Field of the Invention

This invention relates to the structure of a semiconductor device having an unpackaged semiconductor chip mounted on a mounting board via a socket.

2. Background Art

Conventionally known methods of mounting a semiconductor device on a mounting board include methods of bonding a packaged, in most cases, semiconductor chip to the mounting board with solder, mounting a packaged semiconductor chip on the mounting board by inserting it into a socket as with CPUs for personal computers, and mounting a semiconductor chip via bumps. In any of these methods, the device is mounted parallel to the mounting board.

However, in these methods, the area of the mounting board depends on the area of the major surface of the semiconductor chip, and is restricted thereby. Moreover, in the case of mounting with solder, when there is trouble with a semiconductor chip, peeling it off from the mounting board and remounting take much time and effort. Thus there is a problem of increasing cost in conventional techniques.

A conventional technique is disclosed in JP 11-067985A. In this technique, a contact portion is formed on one side of a bare-chip semiconductor pellet. The semiconductor pellet is mounted into a socket having a connection terminal for a chip inside and an external connection terminal outside. A metal film of the semiconductor pellet is connected mechanically to the connection terminal of the socket. The semiconductor pellet can be easily inserted into and extracted from the socket. A plurality of semiconductor pellets can be mounted in parallel. However, in this technique, because the semiconductor chip is arranged perpendicular to the mounting board, heat generated from the semiconductor chip is less likely to escape through the mounting board than in conventional techniques where the semiconductor chip is laid down. Thus there is a problem of heat dissipation in such techniques.

SUMMARY OF THE INVENTION

According to an aspect of the invention, there is provided a semiconductor device comprising: a plurality of semiconductor chips, each of the semiconductor chips having a major surface, a back surface and a plurality of connection terminals on the major surface; a socket having internal connection terminals inside and external connection terminals outside, the internal connection terminals being in contact with the connection terminals of the semiconductor chips; and a mounting board equipped with the socket.

According to other aspect of the invention, there is provided a semiconductor device comprising: one or more semiconductor chips, each of the semiconductor chips having a major surface, a back surface and a plurality of connection terminals on the major surface; a heat dissipating plate bonded to the back surface of the semiconductor chip; a socket having internal connection terminals inside and external connection terminals outside, the internal connection terminals being in contact with the connection terminals of the semiconductor chips; and a mounting board equipped with the socket.

According to other aspect of the invention, there is provided a semiconductor device comprising: a mounting board; a groove formed on a surface of the mounting board; connection terminals formed on the surface of the mounting board; a semiconductor chip having a major surface, a back surface and electrode pads on the major surface thereof, an edge of the semiconductor chip being inserted into the groove; and bumps connecting the electrode pads and the connection terminals electrically.

DETAILED DESCRIPTION OF THE INVENTION

The invention will now be described with reference to the embodiments.

First Embodiment

The first embodiment is described with reference to FIGS. 1 to 4.

Figure 2:
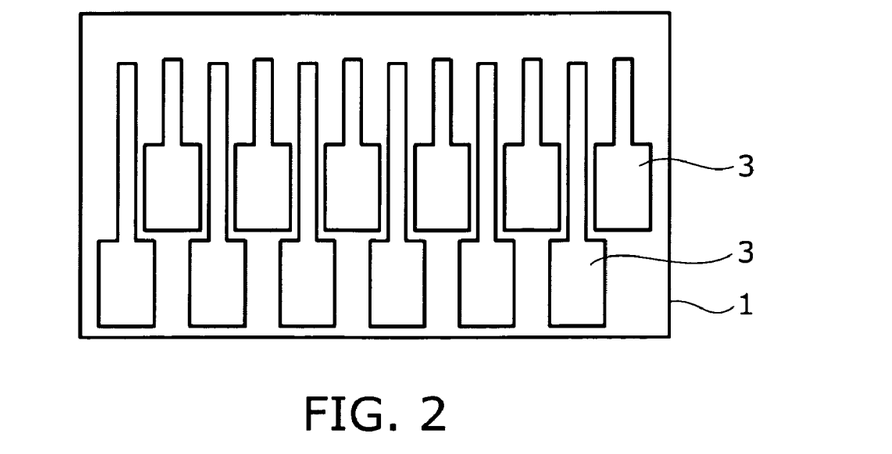
FIG. 2 is a plan view illustrating the arrangement of pads on the semiconductor chip major surface of FIG. 1.
Figure 3:
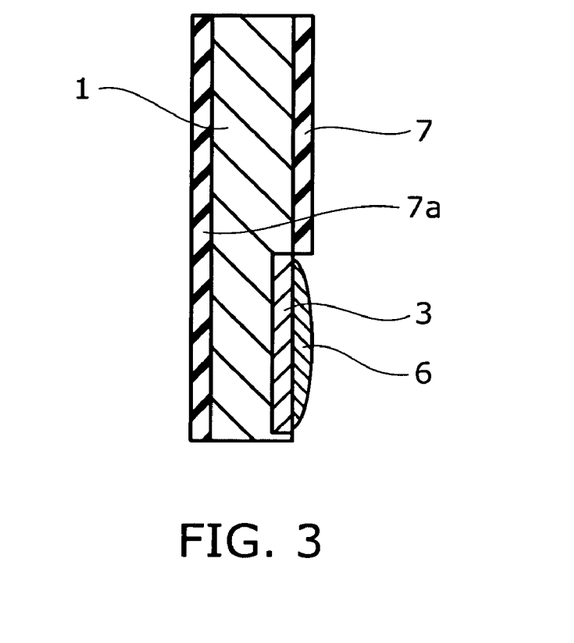
FIG. 3 is a cross section illustrating the pad structure of the semiconductor chip of FIG. 1.
Figure 4:
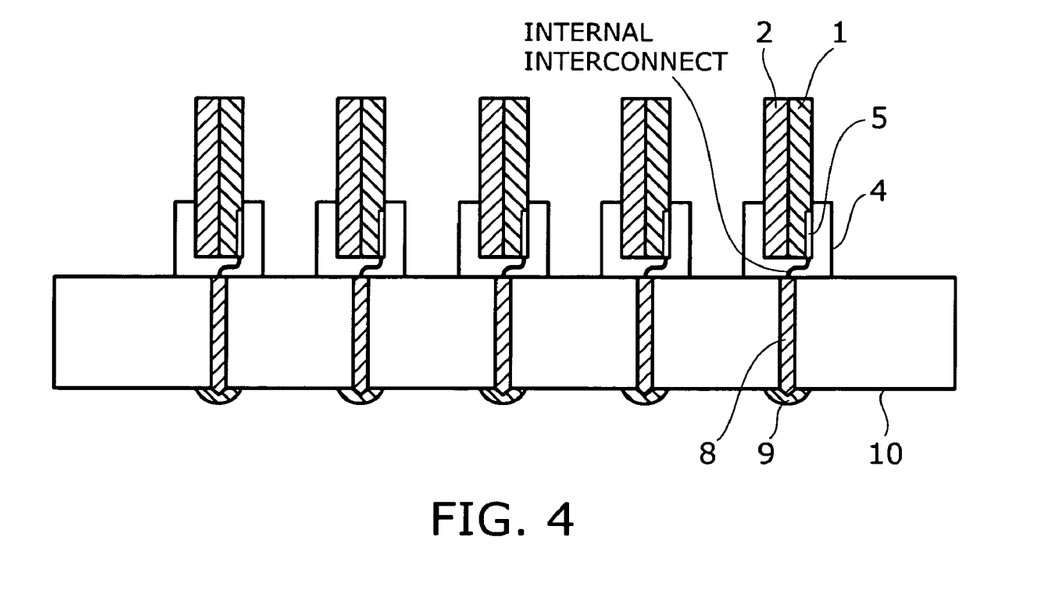
FIG. 4 is a cross section of a mounting board equipped with the sockets of FIG. 1.

FIG. 1 is a perspective view illustrating a process of manufacturing a semiconductor device according to the first embodiment of the invention. FIG. 2 is a plan view illustrating the arrangement of connection electrodes (hereinafter referred to as pads) on the semiconductor chip major surface. FIG. 3 is a cross section illustrating the pad structure of the semiconductor chip. FIG. 4 is a cross section of a mounting board equipped with sockets. In this embodiment, a description is given of an example where two semiconductor chips are bonded together and inserted into one socket.

The semiconductor chips used in this embodiment are a first semiconductor chip 1 (chip A) and a second semiconductor chip 2 (chip B). The first semiconductor chip 1 has a semiconductor integrated circuit (not shown) formed inside, and the semiconductor integrated circuit is electrically connected to a plurality of pads 3 on the surface via an interconnect layer (not shown) on the surface. On the other hand, the second semiconductor chip 2 has a semiconductor integrated circuit (not shown) formed inside, and the semiconductor integrated circuit is electrically connected to the semiconductor integrated circuit in the adjacent semiconductor chip 1 via an interconnect layer (not shown) on the surface and chip connection pads (not shown) connected to this interconnect layer.

FIGS. 2 and 3 illustrate the structure of the pads 3 formed on the semiconductor chip 1. On the major surface of the semiconductor chip 1, pads 3 made of aluminum, copper, or an alloy thereof are formed in a staggered configuration for increasing the arrangement density (FIG. 2). The surface of the pad 3 is covered with gold plating 6 for preventing oxidation. The major surface and the back surface are protectively coated with an insulating film 7 of polyimide, for example, except where the pads 3 are formed.

Figure 1A:
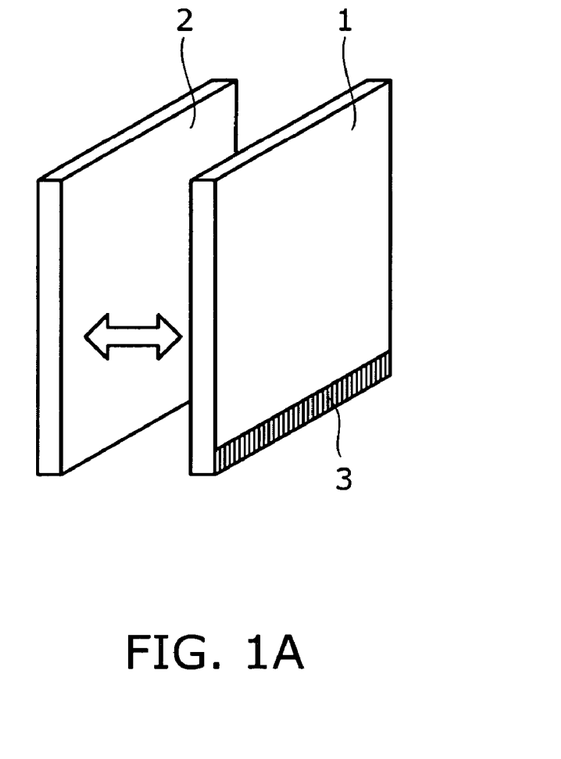
FIG. 1 is a perspective view illustrating a process of manufacturing a semiconductor device according to a first embodiment of the invention.

As shown in FIG. 1, the first semiconductor chip 1 and the second semiconductor chip 2 are bonded together using an adhesive such as epoxy resin (FIG. 1A). The semiconductor integrated circuit formed in the second semiconductor chip 2 is electrically connected to the semiconductor integrated circuit formed in the adjacent semiconductor chip 1 via the interconnect layer (not shown) on the surface and the chip connection pads (not shown) connected to this interconnect layer. The pads 3 are formed on the major surface of the first semiconductor chip 1. The socket 4 comprises a housing having an opening on one side. A plurality of internal connection terminals 5 are provided inside the housing.

Figure 1B:
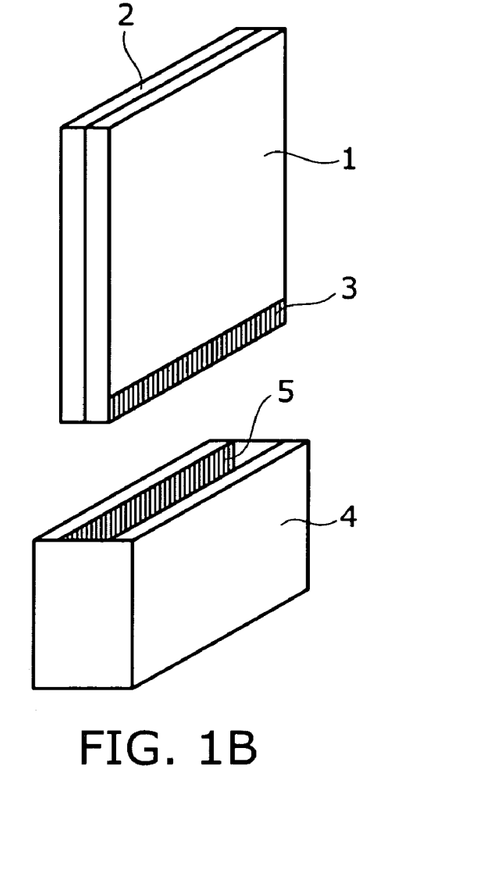

External connection terminals (not shown) are formed outside the housing. The external connection terminals are electrically connected to the internal connection terminals 5 via internal interconnects, and are electrically connected to the connection electrodes that are connected to the interconnects of the mounting board when the socket 4 is attached to the mounting board. As shown in FIG. 1B, the bonded first and second semiconductor chip 1, 2 are inserted inside the housing of the socket 4. When the chips are inserted, the arrangement in the figure is inverted 180 degrees so that the pads 3 are opposed to the internal connection terminals 5, thereby electrically connecting the pads 3 to the internal connection terminals 5. As shown in FIG. 4, the socket 4 is attached to the mounting board 10. At this time, the socket 4 is electrically connected to the connection electrodes (not shown) that are connected to the interconnects (not shown) of the mounting board 10. A single mounting board can be equipped with a plurality of sockets. Note that the shape of the chip, the shape of the pad on the chip, and the shape of the socket are not limited to this embodiment.

Thus, in this embodiment, because of the perpendicular arrangement on the mounting board, the area of the mounting board can be reduced, and the replacement of semiconductor chips can be facilitated. Moreover, because a plurality of semiconductor chips are stacked and inserted into the socket, the mounting efficiency can be enhanced, and the mounting density can be increased. Furthermore, conventionally, a wafer cut from an ingot is lapped to reduce its thickness for packaging. However, this embodiment does not use packaging, but simply uses surface protection with an insulating film, and hence can spare lapping.

Second Embodiment

Next, the second embodiment is described with reference to FIGS. 5 to 7.

Figure 5:
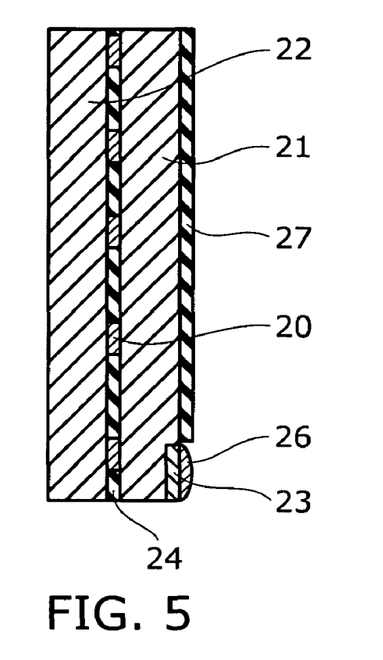
FIGS. 5 to 7 are cross sections showing the combined structure of semiconductor chips constituting a semiconductor device of a second embodiment of the invention.
Figure 6:
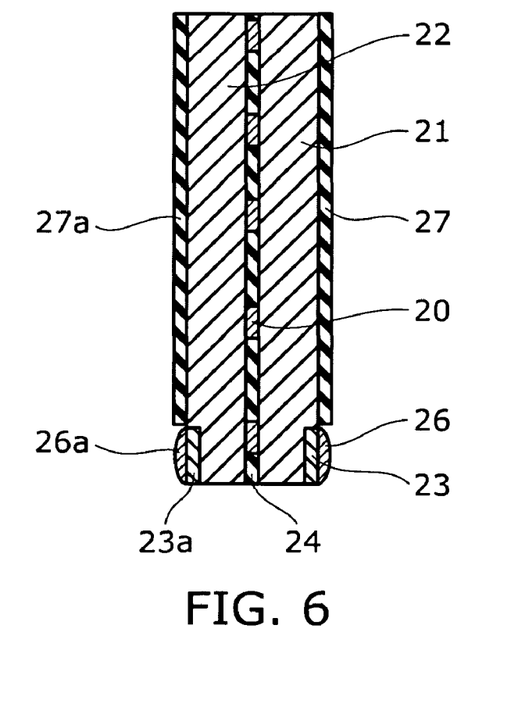
Figure 7:
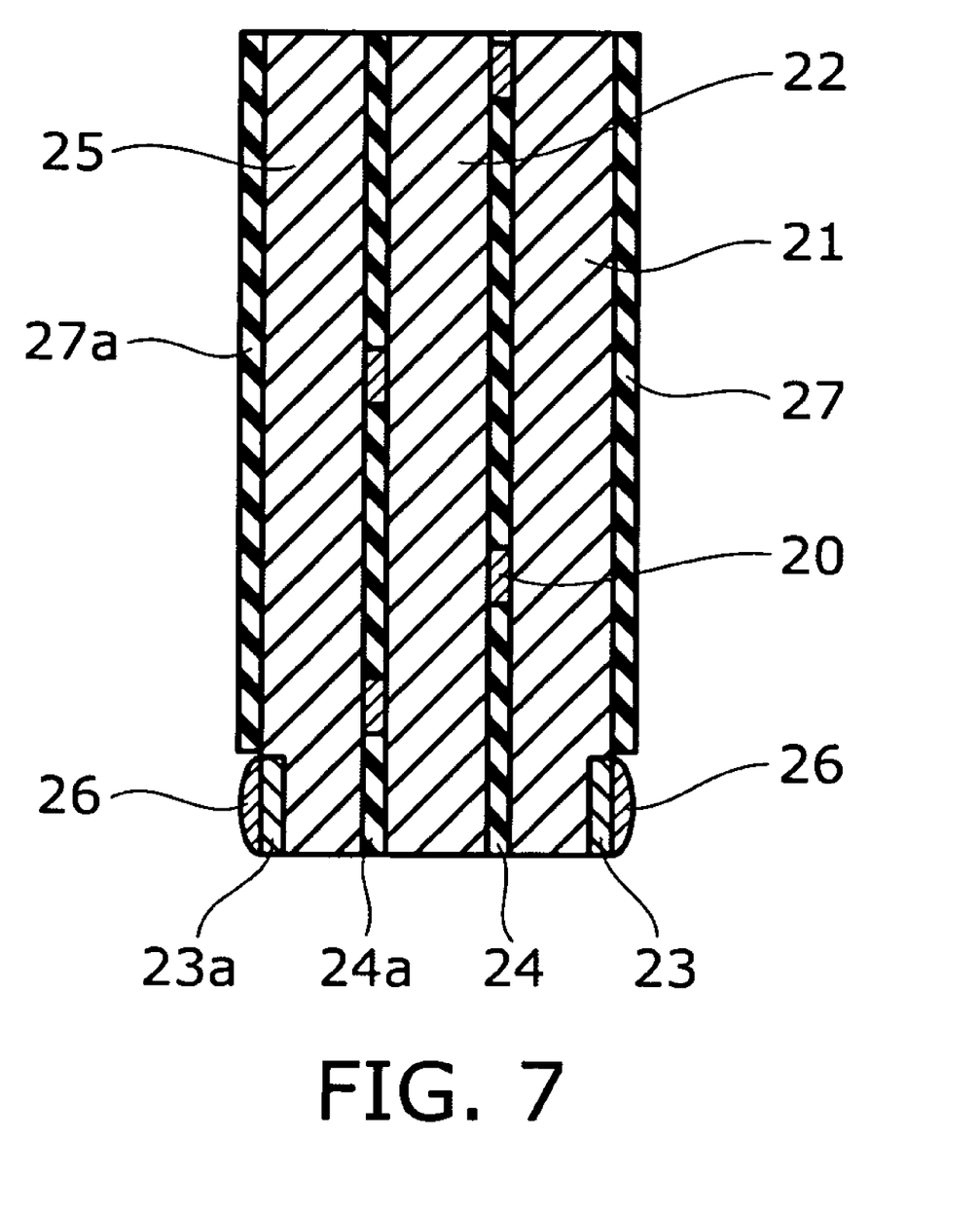

FIGS. 5 to 7 are cross sections showing the combined structure of semiconductor chips constituting a semiconductor device used in this embodiment.

In this embodiment, a plurality of semiconductor chips are bonded together and inserted into one socket. Thus the semiconductor device comprises a plurality of semiconductor chips, at least one socket for receiving a plurality of semiconductor chips, and a mounting board equipped with the socket.

The semiconductor chips used in FIG. 5 are a first semiconductor chip 21 and a second semiconductor chip 22. The first semiconductor chip 21 has a semiconductor integrated circuit (not shown) formed inside, and the semiconductor integrated circuit is electrically connected to a plurality of pads 23 on the surface via an interconnect layer (not shown) on the surface. The pad 23 is protected by a plating layer 26 made of gold plating or solder plating.

On the other hand, the second semiconductor chip 22 has a semiconductor integrated circuit (not shown) formed inside, and the semiconductor integrated circuit is electrically connected to the semiconductor integrated circuit in the adjacent semiconductor chip 21 via an interconnect layer (not shown) on the surface and chip connection pads 20 connected to this interconnect layer. The pads 23 formed on the major surface of the semiconductor chip 21 are made of aluminum, copper, or an alloy thereof and formed in a staggered configuration for increasing the arrangement density. The major surface is protectively coated with an insulating film 27 of polyimide, for example, except where the pads 23 are formed. The back surface of the second semiconductor chip 22 is provided with no insulating film. The first semiconductor chip 21 and the second semiconductor chip 22 are bonded together using an adhesive 24 such as epoxy resin. The semiconductor integrated circuit inside the first semiconductor chip 21 is electrically connected to the semiconductor integrated circuit inside the second semiconductor chip 22 by a plurality of chip connection pads 20 interposed between the semiconductor chips 21, 22.

Next, the bonded first and second semiconductor chip 21, 22 are inserted inside the socket as shown in FIG. 1B, for example. The chips are inserted so that the pads 23 of the first semiconductor chip 21 are opposed to the internal connection terminals provided inside the housing of the socket, thereby electrically connecting the pads 23 to the internal connection terminals. The socket is attached to the mounting board as shown in FIG. 4, for example. At this time, the socket is electrically connected to the connection electrodes that are connected to the interconnects of the mounting board. A single mounting board can be equipped with a plurality of sockets.

The semiconductor chips used in FIG. 6 are a first semiconductor chip 21 and a second semiconductor chip 22. The semiconductor integrated circuit formed inside the first semiconductor chip 21 is electrically connected to a plurality of pads 23 on the surface via an interconnect layer (not shown) on the surface. The pad 23 is protected by a plating layer 26 made of gold plating or solder plating. On the other hand, the semiconductor integrated circuit formed inside the second semiconductor chip 22 is electrically connected to the semiconductor integrated circuit in the adjacent first semiconductor chip 21 via an interconnect layer (not shown) on the surface and chip connection pads 20 connected to this interconnect layer. In this embodiment, a plurality of pads 23a are formed on the major surface of the second semiconductor chip 22 and electrically connected to the semiconductor integrated circuit inside the second semiconductor chip 22. The pads 23, 23a formed on the major surface of the first and second semiconductor chip 21, 22 are made of aluminum, copper, or an alloy thereof and formed in a staggered configuration for increasing the arrangement density. The major surface of the first and second semiconductor chip 21, 22 is protectively coated with an insulating film 27, 27a of polyimide, for example, except where the pads 23, 23a are formed. The first semiconductor chip 21 and the second semiconductor chip 22 are bonded together using an adhesive 24 such as epoxy resin.

Next, the bonded first and second semiconductor chip 21, 22 are inserted inside the socket as shown in FIG. 1B, for example. The chips are inserted so that the pads 23, 23a of the semiconductor chips 21, 22 are opposed to the internal connection terminals provided inside the housing of the socket, thereby electrically connecting the pads 23, 23a to the internal connection terminals. The socket is attached to the mounting board as shown in FIG. 4, for example. At this time, the socket is electrically connected to the connection electrodes that are connected to the interconnects of the mounting board. A single mounting board can be equipped with a plurality of sockets.

The semiconductor chips used in FIG. 7 are a first semiconductor chip 21, a second semiconductor chip 22, and a third semiconductor chip 25. The semiconductor integrated circuit formed inside the first semiconductor chip 21 is electrically connected to a plurality of pads 23 on the surface via an interconnect layer (not shown) on the surface. The pad 23 is protected by a plating layer 26 made of gold plating or solder plating. The semiconductor integrated circuit formed inside the second semiconductor chip 22 is electrically connected to the semiconductor integrated circuit in the adjacent first semiconductor chip 21 via an interconnect layer (not shown) on the surface and chip connection pads 20 connected to this interconnect layer. Furthermore, the semiconductor integrated circuit formed inside the third semiconductor chip 25 is electrically connected to the semiconductor integrated circuit in the adjacent second semiconductor chip 22 via an interconnect layer (not shown) on the surface and chip connection pads 20a connected to this interconnect layer.

In this embodiment, a plurality of pads 23a are formed on the major surface of the third semiconductor chip 25 and electrically connected to the semiconductor integrated circuit inside the third semiconductor chip 25. The pads 23, 23a formed on the major surface of the first and third semiconductor chip 21, 25 are made of aluminum, copper, or an alloy thereof and formed in a staggered configuration for increasing the arrangement density. The major surface of the first and third semiconductor chip 21, 25 is protectively coated with an insulating film 27, 27a of polyimide, for example, except where the pads 23, 23a are formed. The first semiconductor chip 21 and the second semiconductor chip 22 are bonded together using an adhesive 24 such as epoxy resin. The second semiconductor chip 22 and the third semiconductor chip 25 are bonded together using an adhesive 24a such as epoxy resin.

Next, the bonded first, second, and third semiconductor chip 21, 22, 25 are inserted inside the socket as shown in FIG. 1B, for example. The chips are inserted so that the pads 23, 23a of the semiconductor chips 21, 25 are opposed to the internal connection terminals provided inside the housing of the socket, thereby electrically connecting the pads 23, 23a to the internal connection terminals. The socket is attached to the mounting board as shown in FIG. 4, for example. At this time, the socket is electrically connected to the connection electrodes that are connected to the interconnects of the mounting board. A single mounting board can be equipped with a plurality of sockets.

Thus, in this embodiment, because of the perpendicular arrangement on the mounting board, the area of the mounting board can be reduced, and the replacement of semiconductor chips can be facilitated. Moreover, because a plurality of semiconductor chips are stacked and inserted into the socket, the mounting efficiency can be enhanced, and the mounting density can be increased. Furthermore, conventionally, a wafer cut from an ingot is lapped to reduce its thickness for packaging. However, this embodiment does not use packaging, but simply uses surface protection with an insulating film, and hence can spare lapping.

Third Embodiment

The third embodiment is described with reference to FIG. 8.

Figure 8:
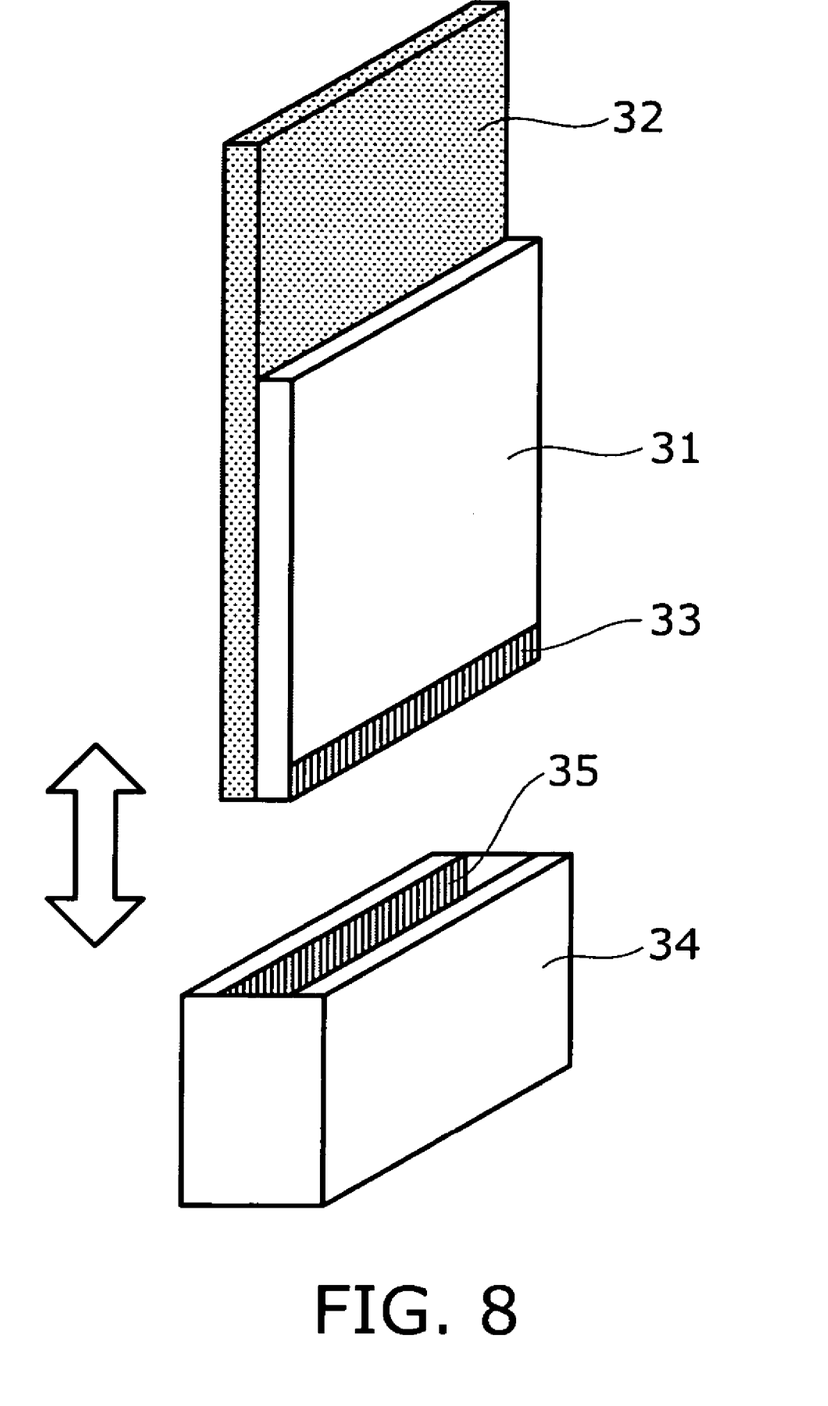
FIG. 8 is a perspective view showing a semiconductor chip with a heat dissipating plate and a socket of a semiconductor device according to a third embodiment of the invention.

FIG. 8 is a perspective view illustrating a process of inserting a semiconductor chip with a heat dissipating plate into a socket in a semiconductor device according to the third embodiment of the invention.

A single semiconductor chip 31 is used in this embodiment. The semiconductor chip 31 has a semiconductor integrated circuit (not shown) formed inside, and the semiconductor integrated circuit is electrically connected to a plurality of pads 33 on the surface via an interconnect layer (not shown) on the surface. On the other hand, a heat dissipating plate 32 is bonded to the back surface of the semiconductor chip 31.

The pads 33 are made of aluminum, copper, or an alloy thereof and formed in a staggered configuration for increasing the arrangement density on the major surface of the semiconductor chip 31, for example. The surface of the pad 33 is covered with gold plating for preventing oxidation. The major surface and the back surface are protectively coated with an insulating film of polyimide, for example, except where the pads 33 are formed.

The semiconductor chip 31 and the heat dissipating plate 32 are bonded together using an adhesive such as epoxy resin. The socket 34 comprises a housing having an opening on one side. A plurality of internal connection terminals 35 are provided inside the housing. External connection terminals (not shown) are formed outside the housing. The external connection terminals are electrically connected to the internal connection terminals 35 via internal interconnects, and are electrically connected to the connection electrodes that are connected to the interconnects of the mounting board when the socket 34 is attached to the mounting board. The bonded semiconductor chip 31 and the heat dissipating plate 32 are inserted inside the housing of the socket 34. When the socket 34 is attached to the mounting board, the socket 34 is electrically connected to the connection electrodes that are connected to the interconnects of the mounting board (see FIG. 4). A single mounting board can be equipped with a plurality of sockets.

Thus, in this embodiment, because of the perpendicular arrangement on the mounting board, the area of the mounting board can be reduced, and the replacement of semiconductor chips can be facilitated. Moreover, because a heat dissipating plate is inserted with the semiconductor chip into one socket, the mounting efficiency can be enhanced while maintaining the heat dissipation property.

Furthermore, the heat dissipating plate can be made of metals with high thermal conductivity such as aluminum and copper or ceramics with high thermal conductivity such as alumina. By using such a heat dissipating plate, the heat dissipation effect can be enhanced, and the strength at the time of insertion or extraction of the semiconductor chip can be increased. Note that the shape of the chip, the shape of the pad on the chip, the shape of the socket, and the shape and material of the heat dissipating plate are not limited to this embodiment.

The need for lapping can be eliminated in the first and second embodiment. In contrast, in the present embodiment, the semiconductor chip can be easily inserted into and extracted from the socket using a thin wafer, because the strength of the semiconductor chip can be increased by using the heat dissipating plate.

Fourth Embodiment

The fourth embodiment is described with reference to FIG. 9.

Figure 9:
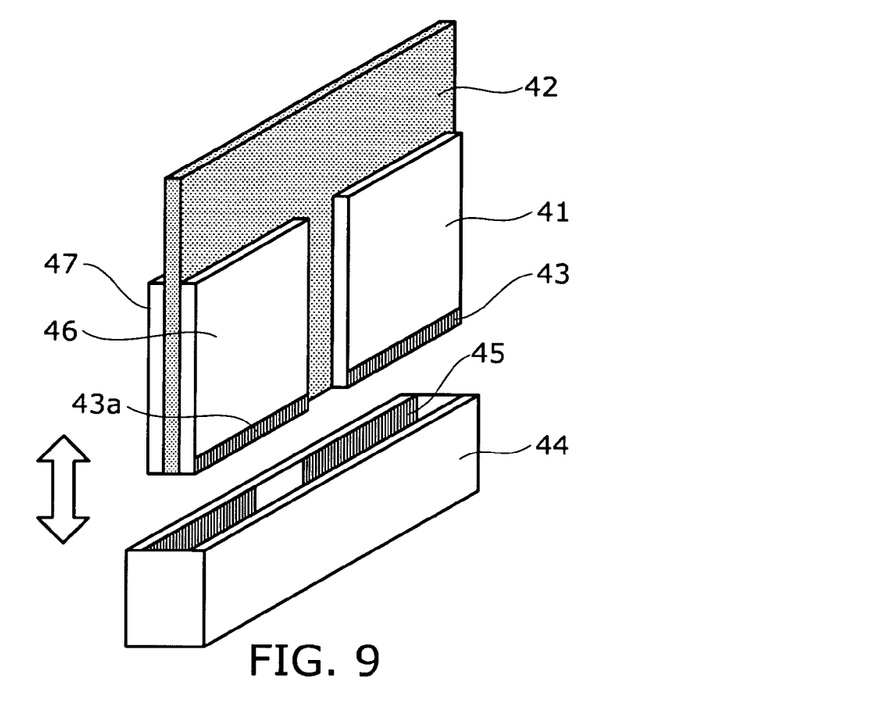
FIG. 9 is a perspective view showing semiconductor chips with a heat dissipating plate and a socket of a semiconductor device according to a fourth embodiment of the invention.

FIG. 9 is a perspective view illustrating a process of inserting semiconductor chips with a heat dissipating plate into a socket in a semiconductor device according to the fourth embodiment of the invention.

One heat dissipating plate and four semiconductor chips are used in this embodiment. A first and second semiconductor chip 41, 46 are bonded to one side of an aluminum or other heat dissipating plate 42, and a third semiconductor chip 47 and a fourth semiconductor chip (not shown) are bonded to the other side. The semiconductor chip has a semiconductor integrated circuit (not shown) formed inside, and the semiconductor integrated circuit is electrically connected to a plurality of pads on the surface via an interconnect layer (not shown) on the surface. In this embodiment, the semiconductor chips 41, 46 are provided with pads 43, 43a. However, the third semiconductor chip 47 and the fourth semiconductor chip are not provided with pads for electrical connection inside the socket.

The pads 43 are made of aluminum, copper, or an alloy thereof and formed in a staggered configuration for increasing the arrangement density on the major surface of the semiconductor chips 41, 46, for example. The surface of the pad 43, 43a is covered with gold plating for preventing oxidation. The major surface and the back surface are protectively coated with an insulating film of polyimide, for example, except where the pads are formed.

The semiconductor chips 41, 46, 47 and the heat dissipating plate 42 are bonded together using an adhesive such as epoxy resin. The socket 44 comprises a housing having an opening on one side. A plurality of internal connection terminals 45 are provided inside the housing. External connection terminals (not shown) are formed outside the housing. The external connection terminals are electrically connected to the internal connection terminals 45 via internal interconnects, and are electrically connected to the connection electrodes that are connected to the interconnects of the mounting board when the socket 44 is attached to the mounting board. The bonded semiconductor chips 41, 46, 47 and the heat dissipating plate 42 are inserted inside the housing of the socket 44. When the socket 44 is attached to the mounting board, the socket 44 is electrically connected to the connection electrodes that are connected to the interconnects of the mounting board (see FIG. 4). A single mounting board can be equipped with a plurality of sockets.

Thus, in this embodiment, because of the perpendicular arrangement on the mounting board, the area of the mounting board can be reduced, and the replacement of semiconductor chips can be facilitated. Moreover, because a heat dissipating plate is inserted with a plurality of semiconductor chips into one socket, the mounting efficiency can be enhanced while maintaining the heat dissipation property.

Furthermore, the heat dissipating plate can be made of metals with high thermal conductivity such as aluminum and copper or ceramics with high thermal conductivity such as alumina. By using this heat dissipating plate, the heat dissipation effect can be enhanced, and the strength at the time of insertion or extraction of the semiconductor chips can be increased. Note that the shape of the chip, the shape of the pad on the chip, the shape of the socket, and the shape and material of the heat dissipating plate are not limited to this embodiment.

Fifth Embodiment

The fifth embodiment is described with reference to FIG. 10.

Figure 10:
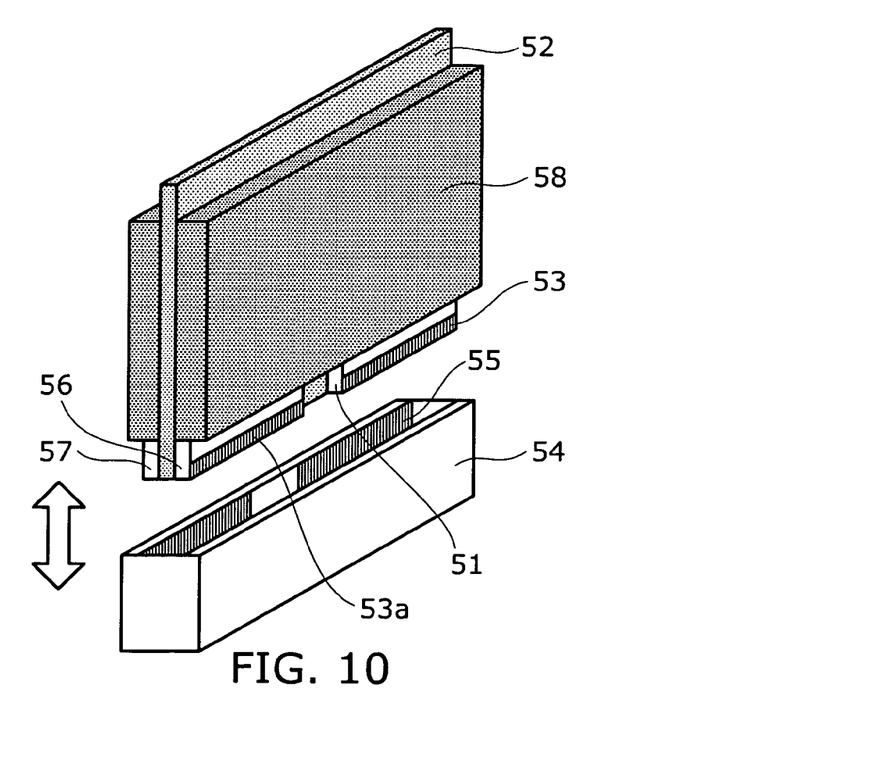
FIG. 10 is a perspective view showing a semiconductor chip with a heat dissipating plate and a socket of a semiconductor device according to a fifth embodiment of the invention.

FIG. 10 is a perspective view illustrating a process of inserting semiconductor chips with a heat dissipating plate into a socket in a semiconductor device according to the fifth embodiment of the invention.

One heat dissipating plate and four semiconductor chips are used in this embodiment. A first and second semiconductor chip 51, 56 are bonded to one side of an aluminum or other heat dissipating plate 52, and a third semiconductor chip 57 and a fourth semiconductor chip (not shown) are bonded to the other side. The semiconductor chip has a semiconductor integrated circuit (not shown) formed inside, and the semiconductor integrated circuit is electrically connected to a plurality of pads on the surface via an interconnect layer (not shown) on the surface. In this embodiment, the semiconductor chips 51, 56 are provided with pads 53, 53a. However, the third semiconductor chip 57 and the fourth semiconductor chip are not provided with pads for electrical connection inside the socket.

The structure of this embodiment is the same as that of FIG. 9. However, this embodiment is characterized in that the surface of the four semiconductor chips 51, 56, 57, except the pads 53, 53a of the semiconductor chips, is covered with a potting resin 58. This facilitates protecting the surface and enhancing the strength of the semiconductor chips.

Thus, in this embodiment, because of the perpendicular arrangement on the mounting board, the area of the mounting board can be reduced, and the replacement of semiconductor chips can be facilitated. Moreover, because a heat dissipating plate is inserted with a plurality of semiconductor chips into one socket, the mounting efficiency can be enhanced while maintaining the heat dissipation property.

Furthermore, the heat dissipating plate can be made of metals with high thermal conductivity such as aluminum and copper or ceramics with high thermal conductivity such as alumina. By using this heat dissipating plate, the heat dissipation effect can be enhanced, and the strength at the time of insertion or extraction of the semiconductor chips can be increased. Note that the shape of the chip, the shape of the pad on the chip, the shape of the socket, and the shape and material of the heat dissipating plate are not limited to this embodiment.

Sixth Embodiment

The sixth embodiment is described with reference to FIGS. 11 and 12.

Figure 11:
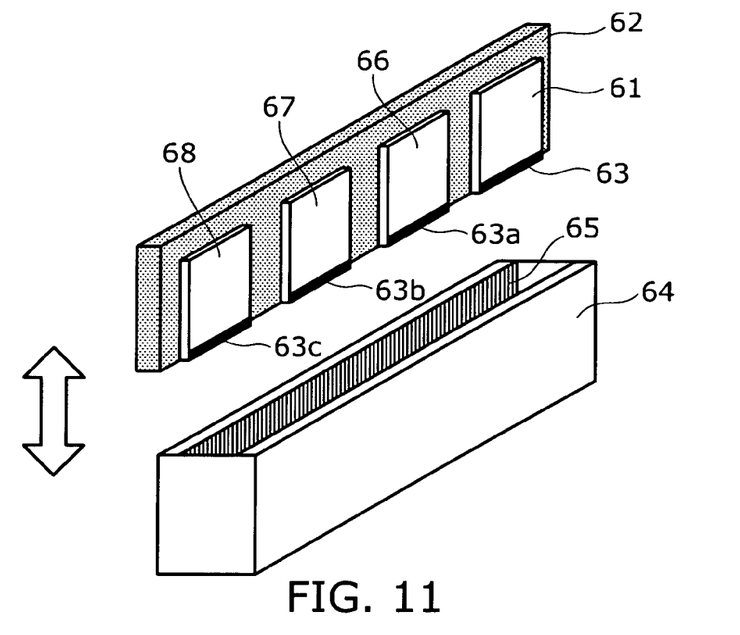
FIG. 11 is a perspective view showing a semiconductor chip with a heat dissipating plate and a socket of a semiconductor device according to a sixth embodiment of the invention.

FIG. 11 is a perspective view illustrating a process of inserting semiconductor chips with a heat dissipating plate into a socket in a semiconductor device according to the sixth embodiment of the invention. FIG. 12 is a cross section showing a variation of this embodiment.

One heat dissipating plate and four semiconductor chips are used in this embodiment. A first to fourth semiconductor chip 61, 66, 67, 68 are bonded to one side of an aluminum or other heat dissipating plate 62. The semiconductor chip has a semiconductor integrated circuit (not shown) formed inside, and the semiconductor integrated circuit is electrically connected to a plurality of pads on the surface via an interconnect layer (not shown) on the surface. In this embodiment, all the semiconductor chips 61, 66, 67, 68 are provided with pads 63, 63a, 63b, 63c. The pads 63, 63a, 63b, 63c are made of aluminum, copper, or an alloy thereof and formed in a staggered configuration, for example, for increasing the arrangement density on the major surface of the semiconductor chips 61, 66, 67, 68. The surface of the pad 63, 63a, 63b, 63c is covered with gold plating for preventing oxidation. The major surface and the back surface are protectively coated with an insulating film of polyimide, for example, except where the pads are formed.

The semiconductor chips 61, 66, 67, and 68 are bonded to one side of the heat dissipating plate 62 using an adhesive such as epoxy resin. The socket 64 comprises a housing having an opening on one side. A plurality of internal connection terminals 65 are provided inside the housing. External connection terminals (not shown) are formed outside the housing. The external connection terminals are electrically connected to the internal connection terminals 65 via internal interconnects, and are electrically connected to the connection electrodes that are connected to the interconnects of the mounting board when the socket 64 is attached to the mounting board. The bonded semiconductor chips 61, 66, 67, 68 and the heat dissipating plate 62 are inserted inside the housing of the socket 64. When the socket 64 is attached to the mounting board, the socket 64 is electrically connected to the connection electrodes that are connected to the interconnects of the mounting board (see FIG. 4). A single mounting board can be equipped with a plurality of sockets.

Thus, in this embodiment, because of the perpendicular arrangement on the mounting board, the area of the mounting board can be reduced, and the replacement of semiconductor chips can be facilitated. Moreover, because a heat dissipating plate is inserted with a plurality of semiconductor chips into one socket, the mounting efficiency can be enhanced while maintaining the heat dissipation property. The heat dissipating plate can be made of metals with high thermal conductivity such as aluminum and copper or ceramics with high thermal conductivity such as alumina. By using this heat dissipating plate, the heat dissipation effect can be enhanced, and the strength at the time of insertion or extraction of the semiconductor chips can be increased. Note that the shape of the chip, the shape of the pad on the chip, the shape of the socket, and the shape and material of the heat dissipating plate are not limited to this embodiment.

In this embodiment, the chip has a rectangular shape. The rectangular shape of the chip ensures a sufficient number of pads and facilitates insertion and extraction of the chips.

Figure 12:
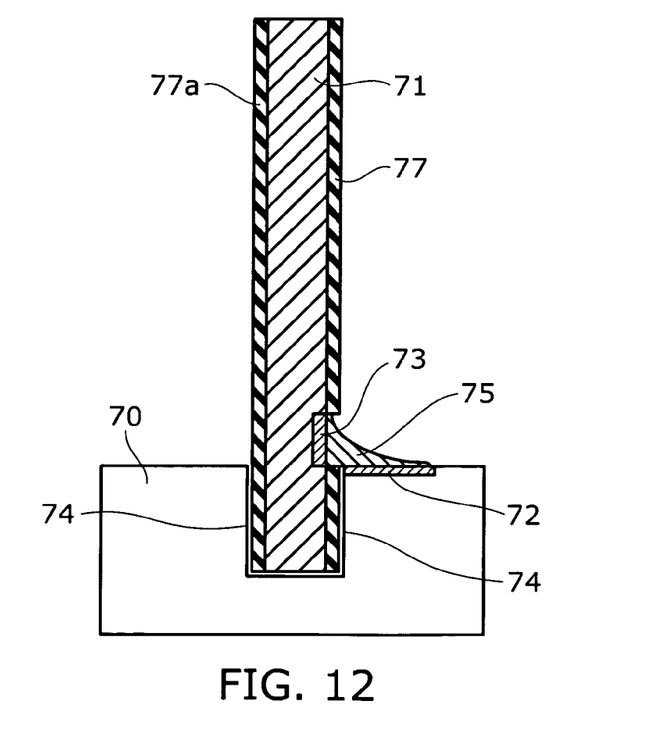
FIG. 12 is a cross section showing a variation of the semiconductor device according to the sixth embodiment of the invention.

Next, reference is made to FIG. 12 to describe an example where a semiconductor chip is perpendicularly mounted on a mounting board. The mounting board 70 is provided with connection terminals (pads) 72 made of aluminum, copper, or an alloy thereof, which are electrically connected to an interconnect pattern (not shown) on the surface of, or inside the mounting board 70. A groove 74 is provided adjacent to the pads 72. The pads 72 and the groove 74 of the mounting board 70 serve as a socket. On a semiconductor chip 71 to be inserted into the groove 74, a plurality of pads 73 are formed in a staggered configuration, for example, on which solder bumps 75 are formed. Furthermore, the major surface and the back surface are protectively coated with an insulating film 77, 77a of polyimide, for example, except where the pads 73 are formed. When the semiconductor chip 71 is inserted, the pads 73 of the semiconductor chip 71 are electrically connected to the pads 72 of the mounting board 70 by the solder bumps 75. A single mounting board can be equipped with a plurality of grooves.

Thus, because of the perpendicular arrangement, this embodiment realizes a semiconductor device which allows the area of the mounting board to be reduced and the replacement of semiconductor chips to be facilitated. Furthermore, because the socket is integrated in the mounting board, the structure is simplified.

The invention claimed is:

1. A semiconductor device comprising:
   a plurality of semiconductor chips, each of the semiconductor chips having a major surface, a back surface, and a plurality of connection terminals on the major surface;
   a socket having internal connection terminals inside and external connection terminals outside; and
   a mounting board equipped with the socket,
   the plurality of semiconductor chips being inserted inside the socket,
   the internal connection terminals being in direct contact with the connection terminals of the semiconductor chips, and
   the back surfaces of at least two of the plurality of semiconductor chips being bonded directly before being inserted into the socket.

2. A semiconductor device according to claim 1, wherein the connection terminals of one of the two of the semiconductor chips are connected to the internal connection terminals.

3. A semiconductor device according to claim 1, wherein each of the two of the semiconductor chips has an integrated circuit and the integrated circuits of the two of the semiconductor chips are electrically connected to each other.

4. A semiconductor device according to claim 1, wherein the connection terminals are formed in a staggered configuration.

5. A semiconductor device according to claim 1, wherein the major surface or the major surface and the back surface of the semiconductor chip is protectively coated with an insulating film except where the connection terminals are formed.

* * * * *